United States Patent [19]

Ball

[11] 4,118,674

[45] Oct. 3, 1978

[54] PHASE LOCKED LOOP INCLUDING ACTIVE LOWPASS FILTER

[75] Inventor: Edward R. Ball, Auburn, Wash.

[73] Assignee: GTE Automatic Electric Laboratories, Incorporated, Northlake, Ill.

[21] Appl. No.: 854,853

[22] Filed: Nov. 25, 1977

[51] Int. Cl.² ............................................. H03B 3/04
[52] U.S. Cl. ...................................... 331/17; 331/25
[58] Field of Search ...................... 331/1 A, 17, 18, 25; 360/51

[56] References Cited

U.S. PATENT DOCUMENTS

| Re. 29,431 | 10/1977 | Desai | 360/51 |
| 3,757,244 | 9/1973 | Giger | 331/17 |
| 3,775,695 | 11/1973 | Hill | 331/4 |

Primary Examiner—Siegfried H. Grimm
Attorney, Agent, or Firm—Russell A. Cannon

[57] ABSTRACT

The phase detector of this phase lock loop includes a transistor switch shaping the output of an Exclusive-OR gate which combines a data signal with a square wave local clock signal from a VCO for producing a digital error signal that is integrated to produce an error voltage that is applied to one side of a differential amplifier in an active lowpass filter. Other means integrates the local clock signal to produce a reference voltage that is applied to the other side of the amplifier, the output of the latter being a control voltage which drives the VCO. In a preferred embodiment, the reference voltage means and the path between the gate and the one side of the amplifier both include a switching transistor (the two being on a common substrate) and resistors of the same type and value for causing variations in the two input lines to the amplifier to track as a function of time and temperature.

19 Claims, 3 Drawing Figures

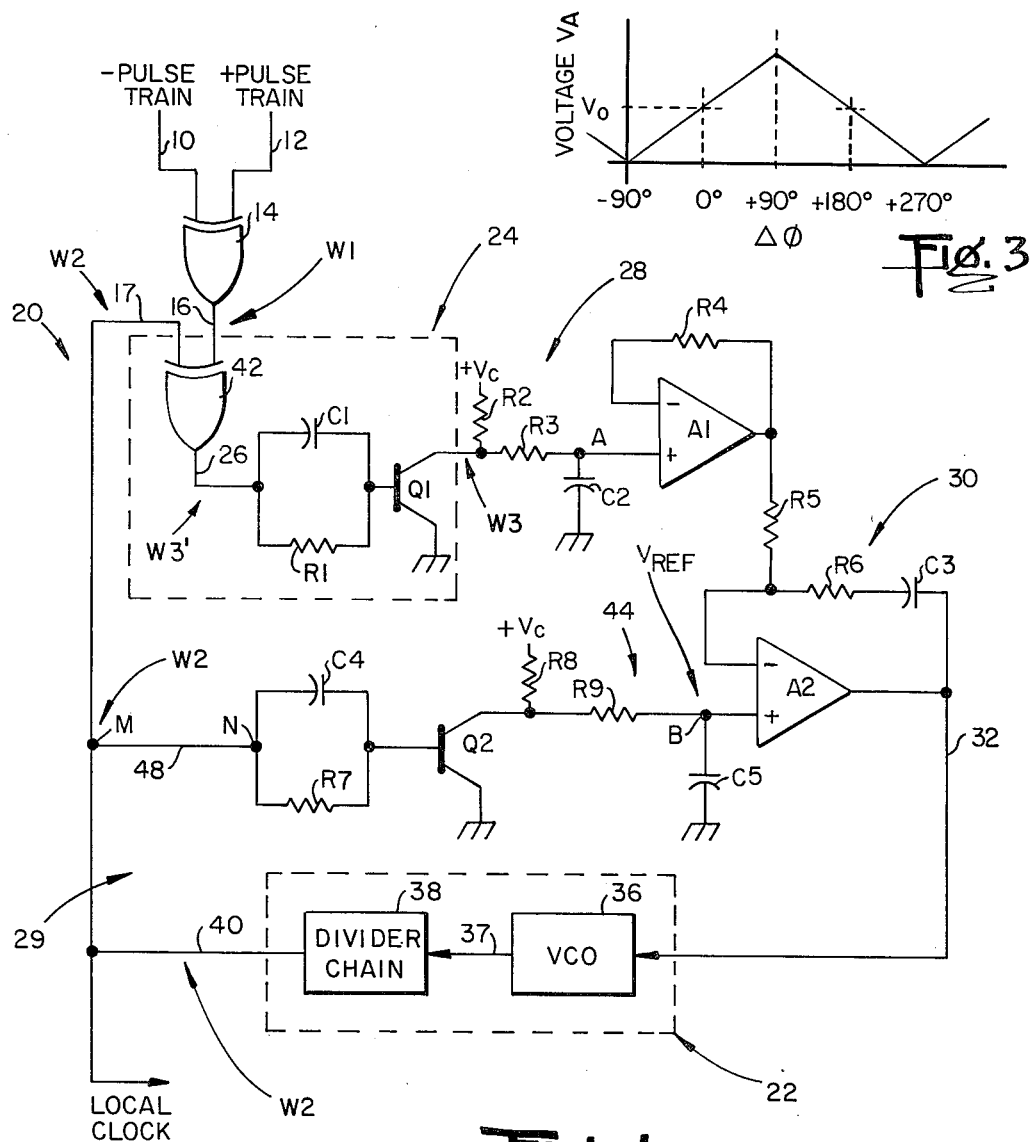
Fig. 3
Fig. 1
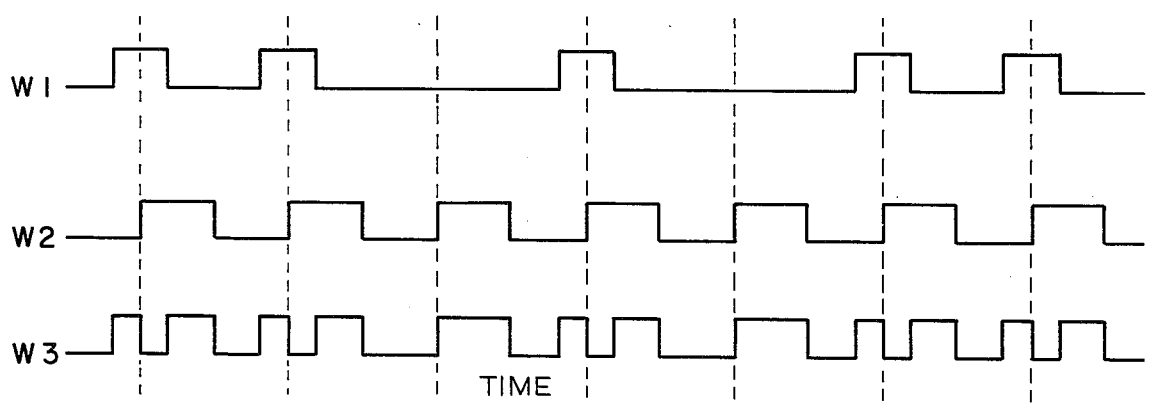
Fig. 2

PHASE LOCKED LOOP INCLUDING ACTIVE LOWPASS FILTER

BACKGROUND OF INVENTION

This invention relates to phase lock loops and, more particularly, to a phase lock loop with an active lowpass filter including a differential amplifier with reference and error voltage input circuits in which variations track as a function of time and temperature.

Phase lock loops are generally employed in AFC, in following a received signal, and in recovery of a clock signal from an input data stream. Such loops are described in the book Phase Lock Techniques by F. M. Gardner, John Wiley & Sons, Inc., 1966. One type of pulse timing recovery circuit using a phase lock loop is described in U.S. Pat. No. 3,757,244, Phase Locked Loop With Non-Linear Filter Responsive To Error Signal Amplitude by A. J. Giger, Sept. 4, 1973. When a high degree of accuracy is required, the loop may employ an active lowpass loop filter since it can have a very high DC gain and correspondingly small phase error. The differential amplifier of such an active filter requires a reference voltage about which it can integrate the output of the phase detector. The U.S. Pat. No. 3,775,695, Phase Lock Loop For A Voltage Controlled Oscillator by C. W. Hill, Nov. 27, 1973, describes a phase lock loop for use in following a target signal frequency. Hill's phase lock loop employs an active loop filter in which the loop error voltage from the phase detector is compared in an integrating amplifier with a fixed DC reference voltage for deriving the control voltage that drives a VCO. Hill's active integrator circuit and/or reference voltage are described in column 2, lines 36–46; column 3, lines 16–22; and column 3, line 63 to column 4, line 4 there. The Bell Telephone Laboratories' 500A type data service unit includes Exclusive-OR function phase detector means and an active filter in a phase lock loop that is employed to recover a clock timing signal from an input data stream. Bell's reference voltage is also a fixed DC value that is produced in a voltage divider circuit. When such a technique is employed, fine tuning adjustments such as selecting a resistor or trimming a potentiometer is required for each unit that is produced. Such a procedure is time consuming. Also, variations in circuit elements and parameters such as are caused by age and changes in temperature will normally produce phase errors in the output of the VCO.

An object of this invention is the provision of an improved phase lock loop which automatically compensates for changes in circuit elements and parameters in the input lines of a differential amplifier of the loop.

SUMMARY OF INVENTION

In accordance with this invention, a phase locked loop for producing a digital square wave output clock signal which is phase locked to a digital input signal that is a series of time slots, each of which may contain a pulse whose timing is initially controlled by a timing signal, comprises: first means which is an oscillator means operative for producing the square wave output clock signal, said oscillator means being responsive to a control voltage for varying the frequency and phase of the clock signal; second means which is a phase detector means producing a digital error signal which is a function of the difference between the phases of pulses in the input and output signals; third means which is a means for integrating the digital error signal for producing an error voltage; fourth means which is means for producing a symmetrical time-varying cyclical signal having a time-averaged value other than zero; fifth means responsive to the cyclical signal for producing a reference voltage that is relatively constant as a function of time; and sixth means for comparing the error voltage and the reference voltage for producing the control voltage which causes the operation and frequency of the oscillator means to vary to make the frequency of the clock signal more nearly equal to an integral multiple of the frequency at which the time slots occur and the phases of pulses in the input and output signals have more nearly a fixed relationship.

DESCRIPTION OF DRAWING

This invention will be more fully understood from the following detailed description, together with the drawing in which:

FIG. 1 is a circuit and block diagram of a phase locked loop 20 embodying this invention;

FIG. 2 is a waveform diagram that is useful in explaining the operation of the loop 20, the wave W1 being an input data signal, the wave W2 being a local clock signal, and the wave W3 being the output of circuit 24; and FIG. 3 is a curve ilustrating the phase difference $\Delta\phi$ between the rising edge of a local clock signal W2 and the center of a data bit in W1, as a function the average value $V_A$ (at node A) of the digital error signal W3.

DESCRIPTION OF PREFERRED EMBODIMENTS

In the transmitter of a data set, a binary signal is accurately converted into a bipolar pulse train, for example, in which binary ones are alternately coded as positive and negative pulses and binary zeros are coded as zeros or the absence of pulses. The timing of the bipolar pulse train is accurately controlled by a clock timing signal. The bipolar signal is distorted during transmission through a transmission medium and must be accurately reconstructed and decoded. In order to accomplish these functions, it is desirable that the receiver in an associated data set have a local clock signal with the same frequency and phase as the timing in the transmitted bipolar signal. Stated differently, it is desirable that the sampling transitions of the local clock signal occur in the centers of data pulses.

In the receiver section of a data set, the distorted bipolar signal may be processed in a conventional manner by slicers (not shown) which determine the timing of leading and trailing edges of reproduced data pulses and extract the positive and negative pulses which are passed in associated pulse trains on lines 10 and 12 in FIG. 1. These two signals are combined in Exclusive-OR gate 14 to produce on line 16 an input signal W1 (see FIG. 2) which is essentially the transmitted bipolar signal reshaped and having the negative pulses inverted so that all data pulses are positive in W1. This signal W1 is related to the original timing signal in that transitions in the initial timing pulses occurred at the same time in each time slot (i.e., the center of a data pulse), some of which do not include positive pulses in W1. It is desirable that the local clock W2 in FIG. 2 be locked in frequency and phase with the timing of the data signal W1 in which the density of pulses to zeros may vary from less than 1:1 to 1:7. More specifically, it is desirable that the sampling transition or rising edge of pulses in the local clock W2 occur in the center of pulses in W1 that are passed by the slicers. Assuming that the eye pattern of received pulses is symmetrical in time with respect to the peak values, this situation gives the most noise immunity. It is not necessary for the reshaped data bits in W1 to have the same pulse width as half of a clock cycle in W2.

A phase lock loop 20 embodying this invention for providing the local clock signal W2 that is phase locked to pulses in the data signal W1 is shown in FIG. 1. The loop 20 comprises a voltage controlled oscillator circuit 22 producing the square wave local clock signal W2, a phase detector circuit 24 comparing the phases of the signals W1 and W2 for producing a digital error signal W3, an RC integrating circuit 28 for providing an error voltage $V_A$ which is the time average of the error signal W3, a circuit 29 which integrates the square wave clock W2 to produce a reference voltage $V_{REF}$, and an active lowpass filter 30 including an integrating differential operational amplifier A2 which integrates the error voltage with respect to the reference voltage to produce a control voltage on line 32 that drives the circuit 22 for adjusting the frequency and phase of the local clock W2.

If the local clock W2 is a square wave (50 percent duty cycle) having a positive transition in the center of each data pulse in W1 (even through W1 may not be a square wave) and the loop is in the locked condition, then over a long period of time the total time that the output W3 of the phase detector circuit is high is substantially equal to the time that it is low. If the active loop filter 30 is designed to integrate the average value of the error signal W3 at node A with respect to a reference voltage at node B, then the filter output on line 32 will cause the VCO to adjust the phase of W2 until the DC signal at node A is substantially equal to $V_{REF}$. It is seen in FIG. 3 that there is an average value $V_O$ of the error voltage $V_A$ which corresponds to a zero degree phase difference $\Delta\phi$ between the rising edge of the local clock W2 and the center of a data bit in W1. If the reference voltage is made equal to this voltage $V_O$, then the loop 20 will lock in this zero degree phase condition. In accordance with this invention, the reference voltage $V_{REF}$ is generated by applying the square wave clock W2 to the circuit 29.

The circuit 22 producing the local clock W2 comprises a voltage controlled oscillator (VCO) 36 and a divider circuit 38. The VCO 36 is a stable voltage controlled oscillator producing a symmetrical output signal having its center frequency $f_o$ equal to an integral multiple of the timing frequency $f_t$ of the data signal W1, which may be 56 kHz. Although $f_o$ may be equal of $f_t$, it is preferable that $f_o$ be greater than $f_t$ since high frequency crystal oscillators are more stable than low frequency ones. Then a divider chain 38 having a symmetrical output may be used to produce a local clock of frequency $f_o$. The VCO 36 may comprise a crystal oscillator operating at a frequency of 8.064 MHz. The VCO 36 output signal is divided down by circuit 38 to produce a 56 kHz square wave signal on line 40 which is the local clock W2. The divider chain 38 is conventional and may comprise a divide-by-9 circuit and a divide-by-16 circuit that are connected in series.

The phase detector circuit 24 comprises an Exclusive-OR gate 42 which compares the local clock W2 with the data signal W1 to produce a digital error signal W3' on line 26 which is related to the difference in the phases of these signals W1 and W2. The signal W3' is coupled through a current-limiting resistor R1 to a transistor switch Q1 which produces the error signal W3 having accurately defined logic output levels which are approximately 0 volts when Q1 is saturated and the peak value at the Q1 collector when Q1 is cut off. The only difference between the signals W3' and W3 is their logic levels. A capacitor C1 is connected in parallel with R1 to speed up the operation of Q1. If the slicers (not shown) are designed to produce a pulse train W1 that is a square wave when a series of binary ones are present in the data stream, then W3 is also generally a square wave signal when the loop is locked so that W1 and W2 are caused to be 90° out-of-phase.

The circuit 28 comprises resistors R2 and R3 and capacitor C2 which integrate the error signal W3 to produce a DC or average error voltage $V_A$ at node A. The capacitor C2 also bypasses high frequency components in W3 to reduce nonlinearities in A1. The DC error voltage on C2 is coupled through a voltage follower A1 and resistor R5 to the negative or one input side of A2. The circuit 30 is essentially an active lowpass filter including the differential amplifier A2 having feedback resistor R6 and feedback capacitor C3 which determine the frequency locking range and dynamic characteristics of the loop. It is necessary to provide the other or positive side of A2 with a reference voltage $V_{REF}$ against which A2 can integrate or average the error voltage $V_A$. The output of A2 on line 32 is a control voltage which causes the operating frequency of VCO 36 and W2 to vary to cause W1 and W2 to be phase locked.

In accordance with this invention, the circuit 29 for providing the reference voltage $V_{REF}$ comprises essentially the same switching and integrating circuitry as is included in the other path for providing the error voltage $V_A$. More specifically, circuit 29 comprises the parallel combination of R7 and C4 having the same values as corresponding elements R1 and C1; a transistor switch Q2; and an integrating circuit 44 comprising R8, R9 and C5. The transistors Q1 and Q2 are matched elements of the same type and are preferably formed on the same substrate so that their characteristics will track each other as a function of temperature. Alternatively, other types of matched switching elements such as FET's and relays may be employed for these transistors. The circuit 44 integrates the square wave clock W2 to produce an average value of reference voltage at node B. The elements R8 and R9 have the same values as the corresponding elements R2 and R3 in the other path. The tolerances of the resistors R2, R3, R8 and R9 are preferably very low, e.g. 1%. It is not necessary that C5 have the same value of capacitance as C2. The capacitors C2, C3 and C5 preferably have low leakage. In this manner, the reference voltage is essentially independent of changes in the input circuit since it will track them. This voltage $V_{REF}$ is also the same value regardless of the frequency and amplitude of W2 since the local clock is a square wave.

Analysis of the operation of integrating circuits 44 and 28 reveals that where the transistors are perfect switches, $V_C$ is the positive supply voltage, and $V_S$ is the saturation voltage on the Q2 collector, then the average DC value of the reference voltage at node B is representable as $$V_{REF} = \frac{V_C \cdot R9 + V_S(R8 + R9)}{R8 + 2R9} \quad (1)$$

As the resistance of R9 is made large with respect to that of R8, the phase error due to any difference between the resistances of R2 and R8 and of R3 and R9 is reduced. In the limiting case when R9/R8 = ∞, then equation (1) reduces to $$V_{REF} = \frac{V_C + V_S}{2} \quad (2)$$

and the tolerances on these resistors R8 and R9 do not contribute to a phase error in the loop 20. In practice, R9 has an upper limit which is dependent on the offset voltage errors induced in A1 and A2 by their respective input bias offset currents. Also, R8 has a lower limit which is dependent on the current capability of Q2. The resistances of R4 and R5 are chosen to minimize any offset voltage errors in A1 and A2. Ideally, the voltages on the + and − terminals of A2 are the same values when the loop is phase locked.

In a phase lock loop that was successfully operated, R1, R2, and R3 had resistances of 11 kohm, 2.15 kohm, and 9.09 kohm; and C1, C2 and C5 had capacitances of 0.01 microfarad, 0.047 microfarad, and 0.1 microfarad, respectively. This loop locked with a phase error of less than ± 4°.

While this invention is described in relation to preferred embodiments thereof, variations and modifications thereof will occur to those skilled in the art without departing from the spirit of this invention. By way of example, the input signal may be a digital signal other than a data signal. Also, a square wave signal other than the local clock W2 may be applied on line 48 to the reference level circuit 29. That is, the frequency of the square wave signals driving circuit 29 and gate 42 may be different. This is accomplished by disconnecting line 48 from node M and connecting a square wave signal generator 70 (not shown) to line 48. Although such a square wave output of generator 70 may have a frequency different from the clock W2, it should have an accurate duty cycle. Increasing the frequency of the signal driving circuit 29 makes it possible to reduce the capacitance of C5. It is preferable, however, that the frequency of this driving signal not be too far removed from the frequency of W2. In order to make the reference circuit 29 more nearly the same as the circuit connected to the negative side of A2, an Exclusive-OR gate may be connected in series with line 48, between nodes M and N. One input to this gate is connected to line 48, the other input being held either high or low. Also, the divider 38 may be omitted and the VCO 36 operated at the timing frequency $f_t$ in W1, the VCO 36 then includes associated circuitry for amplifying and squaring the crystal output to produce a highly accurate duty cycle square wave clock signal on line 37 for driving gate 42. Alternatively, the VCO 36 (with divider 38 omitted) may operate at an odd or even integral multiple of the timing frequency $f_t$, although it is preferable that the VCO 36 frequency be fairly close to the frequency $f_t$. Further, the series combination of each transistor and associated collector resistor (e.g., Q1 and R2) may be replaced by a pair of FET's having their gate electrodes driven by an associated signal W3 or W2. Additionally, the circuit 29 may be driven by a sinusoidal signal on a DC offset voltage that is greater than one-half the amplitude thereof. The scope of this invention is therefore to be determined by the attached claims rather than the aforementioned detailed description.

What is claimed is:

1. A phase locked loop for producing a digital square wave output clock signal which is phase locked to a digital input signal that is a series of time slots, each of which may contain a pulse whose timing is initially controlled by a timing signal, comprising:
   first means which is an oscillator means operative for producing the square wave output clock signal, said oscillator means being responsive to a control voltage for varying the frequency and phase of the clock signal;
   second means which is a phase detector means producing a digital error signal which is a function of the difference between the phases of pulses in the input and output signals;
   third means which is a means for integrating the digital error signal for producing an error voltage;
   fourth means which is means for producing a symmetrical time-varying cyclical signal having a time-averaged value other than zero;
   fifth means responsive to the cyclical signal for producing a reference voltage that is relatively constant as a function of time; and
   sixth means for comparing the error voltage and the reference voltage for producing the control voltage which causes the operation and frequency of the oscillator means to vary to make the frequency of the clock signal more nearly equal to an integral multiple of the frequency at which the time slots occur and the phases of pulses in the input and output signals have more nearly a fixed relationship.

2. The loop according to claim 1 wherein the cyclical signal is a square wave signal.

3. The loop according to claim 2 wherein the frequency of the clock signal is at least substantially equal to an integral multiple of the frequency at which the time slots occur in the input signal, the clock signal having a transition substantially in the center of each pulse in the input signal.

4. The loop according to claim 3 wherein the frequency of the clock signal is substantially equal to that of the time slots in the input signal.

5. The loop according to claim 3 wherein the fifth means comprises seventh means for integrating the cyclical signal for producing the reference voltage.

6. The loop according to claim 5 wherein said third means comprises at least a first resistor and a first capacitor, and said seventh means comprises at least a second resistor and a second capacitor, said first and second resistors being of the same type and having the same values.

7. The loop according to claim 6 wherein said second means comprises a first transistor switch at the output thereof for driving said first-named integrating means, said fifth means including a second transistor switch driving said second-named integrating means, said first and second transistors being transistors formed on the same substrate so that changes in temperature produce the same variation in the two input line paths to said sixth (comparing) means for causing the reference voltage to remain at substantially the same relative value.

8. The loop according to claim 7 wherein the fourth means producing the cyclical signal comprises the first means and the cyclical signal is the square wave clock signal.

9. The loop according to claim 8 wherein the frequency of the clock signal is substantially equal to that of the time slots in the input signal.

10. The loop according to claim 9 wherein said sixth means comprises an integrating differential amplifier.

11. The loop according to claim 10 wherein said second means comprises Exclusive-OR gate means.

12. A phase-locked loop receiving a digital input data signal that is a series of time slots in which a pulse whose timing is initially controlled by a timing signal may or may not be present and producing a digital square wave output clock signal that is phase locked to the data signal, comprising:

first oscillator means producing the square wave clock signal which has a frequency that is at least substantially equal to an integral multiple of the frequency of the initial timing signal at which the time slots occur, said first oscillator means being responsive to a control voltage for varying the frequency and phase of the clock signal;

second oscillator means for producing a symmetrical time-varying cyclical signal having a time-averaged value other than zero;

phase detector means producing a digital error signal which is a function of the difference between the phases of pulses in the data and clock signals;

first means for integrating the digital error signal for producing an error voltage;

means responsive to the cyclical signal from the second oscillator means for producing a reference voltage; and means for comparing the error voltage and the reference voltage for producing the control voltage which causes the operating frequency of the first oscillator means to vary to make the frequency of the clock signal more nearly equal to an integral multiple of the data rate at which time slots occur in the data signal and make the phases of pulses in the data and clock signals have more nearly a fixed relationship;

said reference voltage means including substantially the same circuit elements which may be subject to variation with temperature and time as are in the path for developing and coupling the error signal voltage to said comparing means.

13. The loop according to claim 12 wherein said first oscillator means comprises said second oscillator means and the cyclical signal is the clock signal which has a transition substantially in the center of each pulse in the data signal when the loop is in the locked condition.

14. The loop according to claim 13 wherein said first integrating means comprises a first resistor and a first capacitor electrically connected in series between a supply voltage and a ground reference potential; and said reference voltage means comprises second integrating means including a second resistor and a second capacitor electrically connected in series between the supply voltage and ground, the first and second resistors being of the same type and having the same values.

15. The loop according to claim 14 including third and fourth resistors in the electrical connections of the first and second resistors to the supply voltage, said third and fourth resistors being the same type and having the same value.

16. The loop according to claim 15 wherein said phase detector means comprises a first transistor switch electrically connected between the junction of said first and third resistors and ground; and said reference voltage means comprises a second transistor switch electrically connected between the junction of said second and fourth resistors and ground, said first and second transistors being matched transistors that are formed on the same substrate so that changes in temperature cause changes in the characteristics of the two input paths to said comparing means which track each other.

17. The loop according to claim 16 wherein said phase detector means comprises a first Exclusive-OR gate means and a fifth resistor electrically connecting the output of said first Exclusive-OR gate means to a base electrode of said first transistor, said reference voltage means including a sixth resistor electrically connected to a base electrode of said second transistor; said fifth and sixth resistors being of the same type and having the same values of resistance.

18. The loop according to claim 17 wherein said reference voltage means includes a second Exclusive-OR gate means having an output connected to said sixth resistor; said first and second gate means being matched and formed on the same substrate and being elements in the same integrated circuit.

19. The loop according to claim 18 including third and fourth capacitors electrically connected in shunt with said fifth and sixth resistors, respectively, said third and fourth capacitors being of the same type and having the same values of capacitance; said comparing means comprising an integrating differential operational amplifier.

* * * * *